(12) United States Patent
Kawashima et al.

(10) Patent No.: US 11,245,821 B2
(45) Date of Patent: Feb. 8, 2022

(54) IMAGE PICKUP APPARATUS COMPRISING HEAT TRANSFER MEMBER CONNECTED BETWEEN A CIRCUIT BOARD EQUIPPED WITH HEATING ELEMENT AND A CHASSIS

(71) Applicant: CANON KABUSHIKI KAISHA, Tokyo (JP)

(72) Inventors: Hideki Kawashima, Tokyo (JP); Keiji Honda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/229,700

(22) Filed: Apr. 13, 2021

(65) Prior Publication Data

US 2021/0337096 A1 Oct. 28, 2021

(30) Foreign Application Priority Data

Apr. 22, 2020 (JP) .............................. JP2020-076140

(51) Int. Cl.
*H04N 5/225* (2006.01)
*H05K 1/02* (2006.01)
(Continued)

(52) U.S. Cl.
CPC ......... *H04N 5/22521* (2018.08); *G03B 17/55* (2013.01); *H04N 5/2253* (2013.01);
(Continued)

(58) Field of Classification Search
CPC .. H04N 5/22521; H04N 5/225; H04N 5/2251; H04N 5/2252; H04N 5/2253;
(Continued)

(56) References Cited

U.S. PATENT DOCUMENTS 6,078,359 A * 6/2000 Conder ................ H05K 3/4641
348/374
9,674,986 B2 * 6/2017 Pope ...................... H05K 7/205
(Continued)

FOREIGN PATENT DOCUMENTS

JP 2011-23647 A 2/2011
JP 2011023647 A * 2/2011 ............. G03B 17/02

*Primary Examiner* — Twyler L Haskins
*Assistant Examiner* — Akshay Trehan
(74) *Attorney, Agent, or Firm* — Canon U.S.A., Inc. I.P. Division

(57) ABSTRACT

An image pickup apparatus which is capable of efficiently dispersing heat from a circuit board. A heating element is mounted on the circuit board. A heat transfer member made of a material with higher thermal conductivity than that of a chassis is disposed between the circuit board and the chassis in a direction of an optical axis. First connecting units support the circuit board and the heat transfer member in a stacked manner at a plurality of positions including two positions different from each other in a horizontal direction. A second connecting unit supports the heat transfer member. A third connecting unit supports an exterior member of the image pickup apparatus. Both the second connecting unit and the third connecting unit are provided between the two positions of the first connecting units in the horizontal direction.

10 Claims, 6 Drawing Sheets

(51) Int. Cl.
*H05K 7/20* (2006.01)
*G03B 17/55* (2021.01)

(52) U.S. Cl.
CPC ......... *H05K 1/0201* (2013.01); *H05K 7/2039* (2013.01); *G03B 2217/002* (2013.01)

(58) Field of Classification Search
CPC .............. H04N 5/2254; H04N 5/2257; H05K 1/0201–021; H05K 7/2039–20518; G03B 17/00; G03B 17/02; G03B 17/55; G03B 2217/00
USPC .......................... 348/373–376; 396/419, 535
See application file for complete search history.

(56) References Cited

U.S. PATENT DOCUMENTS

| | | | |
|---|---|---|---|
| 10,133,158 B2* | 11/2018 | Yasuda | H04N 5/2252 |
| 2009/0237537 A1* | 9/2009 | Maruyama | G03B 17/02 |
| | | | 348/294 |
| 2010/0061716 A1* | 3/2010 | Iyoda | G03B 17/55 |
| | | | 396/535 |
| 2011/0234892 A1* | 9/2011 | Yasuda | G03B 17/02 |
| | | | 348/374 |
| 2015/0049243 A1* | 2/2015 | Samuels | G03B 17/55 |
| | | | 348/374 |
| 2017/0042058 A1* | 2/2017 | Pope | H05K 7/205 |
| 2017/0208227 A1* | 7/2017 | Tsuchida | G03B 17/55 |
| 2018/0107099 A1* | 4/2018 | Yasuda | H04N 5/22521 |
| 2019/0335075 A1* | 10/2019 | Ueda | H01Q 1/2291 |

* cited by examiner

IMAGE PICKUP APPARATUS COMPRISING HEAT TRANSFER MEMBER CONNECTED BETWEEN A CIRCUIT BOARD EQUIPPED WITH HEATING ELEMENT AND A CHASSIS

BACKGROUND

Field of the Disclosure

The present disclosure generally relates to an image pickup apparatus having a circuit board equipped with a heating element.

Description of the Related Art

In an image pickup apparatus such as a digital camera, due to continuous shooting operations, increased resolution of an image pickup device, improvement in CPU processing speed, and so forth, the power consumption has been growing, and also the amount of heat generated in the image pickup apparatus has been increasing. Accordingly, to efficiently disperse heat in the image pickup apparatus, there has been proposed an arrangement in which a plate with higher thermal conductivity than that of a main chassis is provided between the main chassis and an exterior member in an arrangement in which a circuit board having a heating source is fixed to the main chassis (Japanese Laid-Open Patent Publication (Kokai) No. 2011-23647). The plate is in contact with and fixed to a rear surface of the main chassis. As a result, heat generated by the circuit board can be efficiently dispersed along the rear surface of the main chassis. Moreover, sandwiching the plate between the main chassis and the exterior member makes it less likely for heat, which is transferred from the circuit board to the main chassis, to be transferred to the exterior member.

In the arrangement described in Japanese Laid-Open Patent Publication (Kokai) No. 2011-23647, when the amount of heat generated by the circuit board has further increased, heat transfer using only the plate has a limitation. For example, when a process with high load such as video shooting is continuously carried out, it may not continue the process as long as possible.

SUMMARY

The present disclosure generally relates to an image pickup apparatus which is capable of efficiently dispersing heat of a circuit board.

Accordingly, the present disclosure includes an image pickup apparatus comprising an exterior member, a circuit board on which a heating element is mounted, a chassis to which the exterior member is fitted, and a heat transfer member which is made of a material with higher thermal conductivity than that of the chassis and is disposed between the circuit board and the chassis in a direction of an optical axis, wherein the chassis comprises first connecting units that support the circuit board and the heat transfer member in a stacked manner at a plurality of positions including two positions different from each other in a horizontal direction, a second connecting unit that supports the heat transfer member, a third connecting unit that supports the exterior member, and wherein both the second connecting unit and the third connecting unit are provided between the two positions of the first connecting units in the horizontal direction.

According to the present disclosure, heat of the circuit board can be efficiently dispersed.

Further features of the present disclosure will become apparent from the following description of exemplary embodiments (with reference to the attached drawings).

DESCRIPTION OF THE EMBODIMENTS

The present disclosure will now be described in detail with reference to the accompanying drawings showing an embodiment thereof.

Figure 1A:
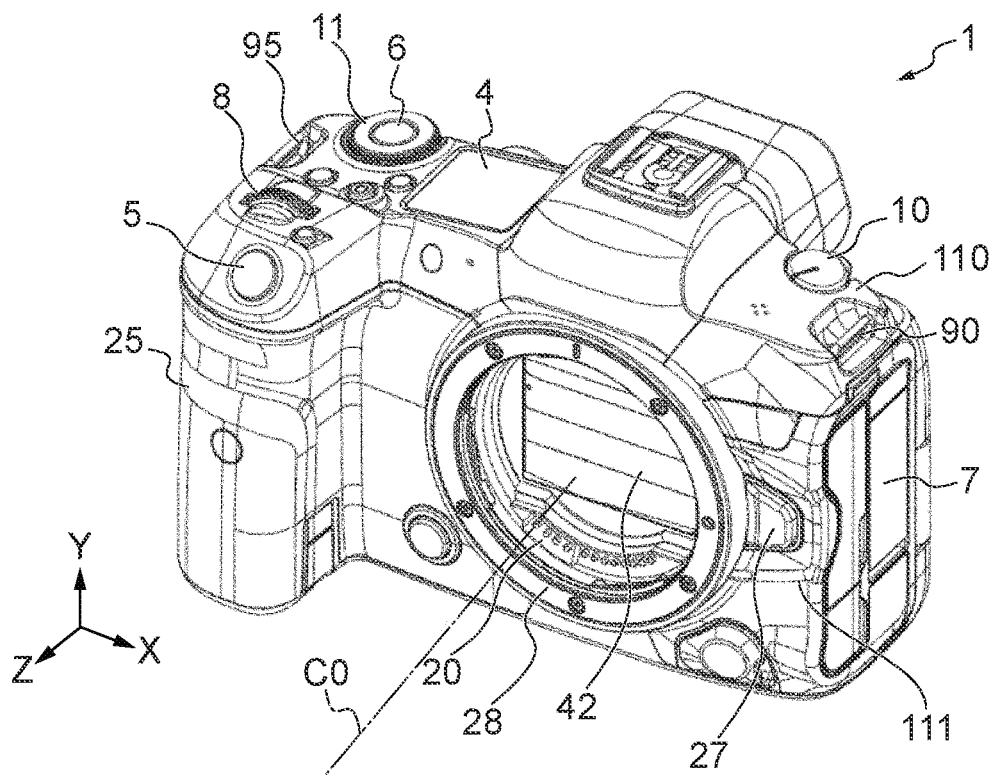
FIGS. 1A and 1B are perspective views of an image pickup apparatus.
Figure 1B:
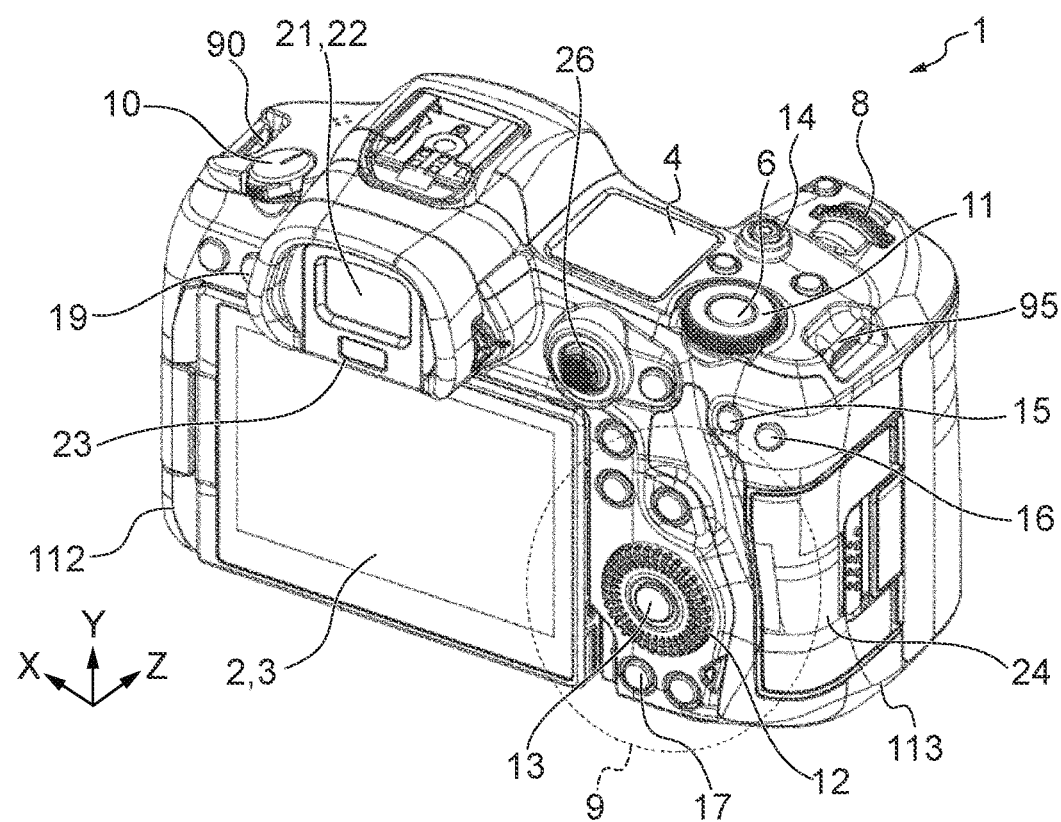

FIGS. 1A and 1B are perspective views of an image pickup apparatus 1 according to an embodiment of the present disclosure. FIG. 1A is a perspective view of the image pickup apparatus 1 seen from the front side, and FIG. 1B is a perspective view of the image pickup apparatus 1 seen from the rear side.

The image pickup apparatus 1 is an interchangeable-lens digital camera. A lens mount unit 28 is provided on a front side of the image pickup apparatus 1. The lens mount unit 28 is a place on which a taken lens removable from the image pickup apparatus 1 is mounted. An optical axis of the taking lens attached to the image pickup apparatus 1 is referred to as the optical axis CO. In the following description, orientations of components are designated with reference to X, Y, and Z coordinate axes in FIGS. 1A, 1B, etc. Here, for the sake of convenience, in a direction parallel to the optical axis CO, a subject side is referred to as the front, and a direction in which a rear cover 112 is seen from the lens mount unit 28 is referred to as the rear. Horizontal directions are based on directions seen from a side on which a user mainly lies, that is, a rear side. Thus, for example, in FIGS. 1A and 1B, a +Y direction is an upward direction, and a +Z direction is a forward direction. A +X direction is a leftward direction as seen from the rear.

An exterior of the image pickup apparatus 1 is comprised mainly of an upper cover 110, a front cover 111, a rear cover 112, and a lower cover 113. The upper cover 110 and the rear cover 112 are metallic components molded of a magnesium alloy by die casting. The front cover 111 and the lower cover 113 are resin components molded of polycarbonate by injection molding.

A display unit 2 is provided on a rear surface of the image pickup apparatus 1. The display unit 2 displays images and various types of information. A display surface of the display unit 2 is a touch panel 3. The touch panel 3 detects touch operations performed on the display surface (operating surface) of the display unit 2. An out-of-viewfinder display unit 4, a shutter button 5, and a mode selector switch 6 are provided on an upper surface of the image pickup apparatus 1. The out-of-viewfinder display unit 4 displays a variety of camera setting values such as a shutter speed and an aperture value. The shutter button 5 is an operating unit for giving an instruction to take a shot. The mode selector switch 6 is an operating unit for switching among various modes.

A main electronic dial 8 is disposed close to the shutter button 5. The main electronic dial 8 is a rotary member. A user is able to change setting values such as a shutter speed and an aperture value by rotating the main electronic dial 8. A sub electronic dial 11 is disposed to surround the mode selector switch 6. The sub electronic dial 11 is a rotary member and used to, for example, switch selection frames and feed images. A video button 14 is disposed between the sub electronic dial 11 and the main electronic dial 8. The video button 14 is used to give an instruction to start/stop video shooting (recording).

A terminal cover 7 is disposed on a left side (+X side) of the image pickup apparatus 1. The terminal cover 7 protects a connector (not shown) such as a connecting cable that connects an external device and the image pickup apparatus 1 together. A power switch 10 is disposed in a left part of an upper surface of the image pickup apparatus 1. The power switch 10 is an operating member that turns on and off the power to the image pickup apparatus 1.

On the rear surface of the image pickup apparatus 1, an operating unit 9 is disposed adjacently to the display unit 2. The operating unit 9 is comprised of a plurality of push buttons, a rear dial 12, and so forth. The rear dial 12 is a rotary member, and the user is able to change setting values such as a shutter speed and an aperture value by rotating the rear dial 12. A SET button 13 is disposed in a central part of the rear dial 12. The SET button 13 is a push button and mainly used to, for example, accept a selection of item.

A selecting member 26 is disposed above the operating unit 9. The selecting member 26 is a multi-controller that is capable of being operated in eight directions i.e. upward, downward, leftward, and rightward directions as well as diagonal directions, and also its center is capable of accepting a depressing operation. A corresponding operation can be performed according to a part depressed of the selecting member 26. An AE lock button 15 is disposed above the operating unit 9. The AE lock button 15 is capable of being depressed in a shooting standby state to fix an exposed state. A zoom button 16 is disposed adjacently to the AE lock button 15. The zoom button 16 is an operating button for turning on/off a zoom mode during live view display in a shooting mode. By operating the main electronic dial 8 after turning on the zoom mode, a live view can be zoomed in/out. The enlarge button 16 is also used to zoom in an image played back in a playback mode and increase a zoom ratio.

A playback button 17 is disposed in a lower part of the operating unit 9. The playback button 17 is an operating button for switching between the shooting mode and the playback mode. By depressing the playback button 17 in the shooting mode, the image pickup apparatus 1 shifts to the playback mode so that the newest one of images recorded on a recording medium (not shown) can be displayed on the display unit 2. A lid 24 is disposed adjacently to the operating unit 9 including the playback button 17. The lid 24 is a cover for a slot in which the recording medium (not shown) is housed.

A menu button 19 is disposed on an upper left of the display unit 2 on the rear surface of the image pickup apparatus 1. The menu button 19 is a push button. When the menu button 19 is depressed, a menu screen on which various settings can be made is displayed on the display unit 2. The user can intuitively make various settings using the menu screen displayed on the display unit 12, the rear dial 12, and the SET button 13.

An eyepiece unit 21 is disposed above the display unit 2. The eyepiece unit 21 is an eyepiece portion of an eyepiece view finder. The user can visually identify an image displayed on an EVF 22, which is provided inside the image pickup apparatus 1, by looking through the eyepiece unit 21. An eye-contact sensing unit 23 is provided just below the eyepiece unit 21. The eye-contact sensing unit 23 is a sensor that detects whether or not the user is in contact with the eyepiece unit 21.

A right end portion of the image pickup apparatus 1 is a grip unit 25. The grip unit 25 is a holding unit shaped so that the user can easily grip it with his/her right hand when holding the image pickup apparatus 1. The shutter button 5 and the main electronic dial 8 described above are disposed at locations where the user can operate them with his/her right index finger while holding the image pickup apparatus 1 by gripping the grip unit 25 with his/her little finger, ring finger, and middle finger. The sub electronic dial 11 and the selecting member 26 described above are disposed at locations where the user can operate them with his/her right thumb while holding the image pickup apparatus 1.

A communication terminal 20 is provided in a lower part of an inside of the lens mount unit 28. Communications are carried out between the image pickup apparatus 1 and a lens through the communication terminal 20. An image pickup device 600 (FIG. 3B) is supported inside the lens mount unit 28. The image pickup device 600 is a CMOS sensor that converts captured optical information into a signal. A lock button 27 is disposed on a left side of the lens mount unit 28. The lock button 27 functions as a lock mechanism (not shown) for holding a lens when the lens is mounted on the image pickup apparatus 1.

By depressing the lock button 27, the user can release the lock mechanism to remove the lens.

Strap insertion members 90 and 95 are provided on left and right ends, respectively, of an upper part of the image pickup apparatus 1. A strap can be inserted into each of the strap insertion members 90 and 95. The user inserts cord-like members (not shown) such as straps into the strap insertion members 90 and 95 so that he/she can carry the image pickup apparatus 1 by hanging it around his/her neck or the like.

A description will now be given of an internal arrangement of the image pickup apparatus 1.

Figure 2:
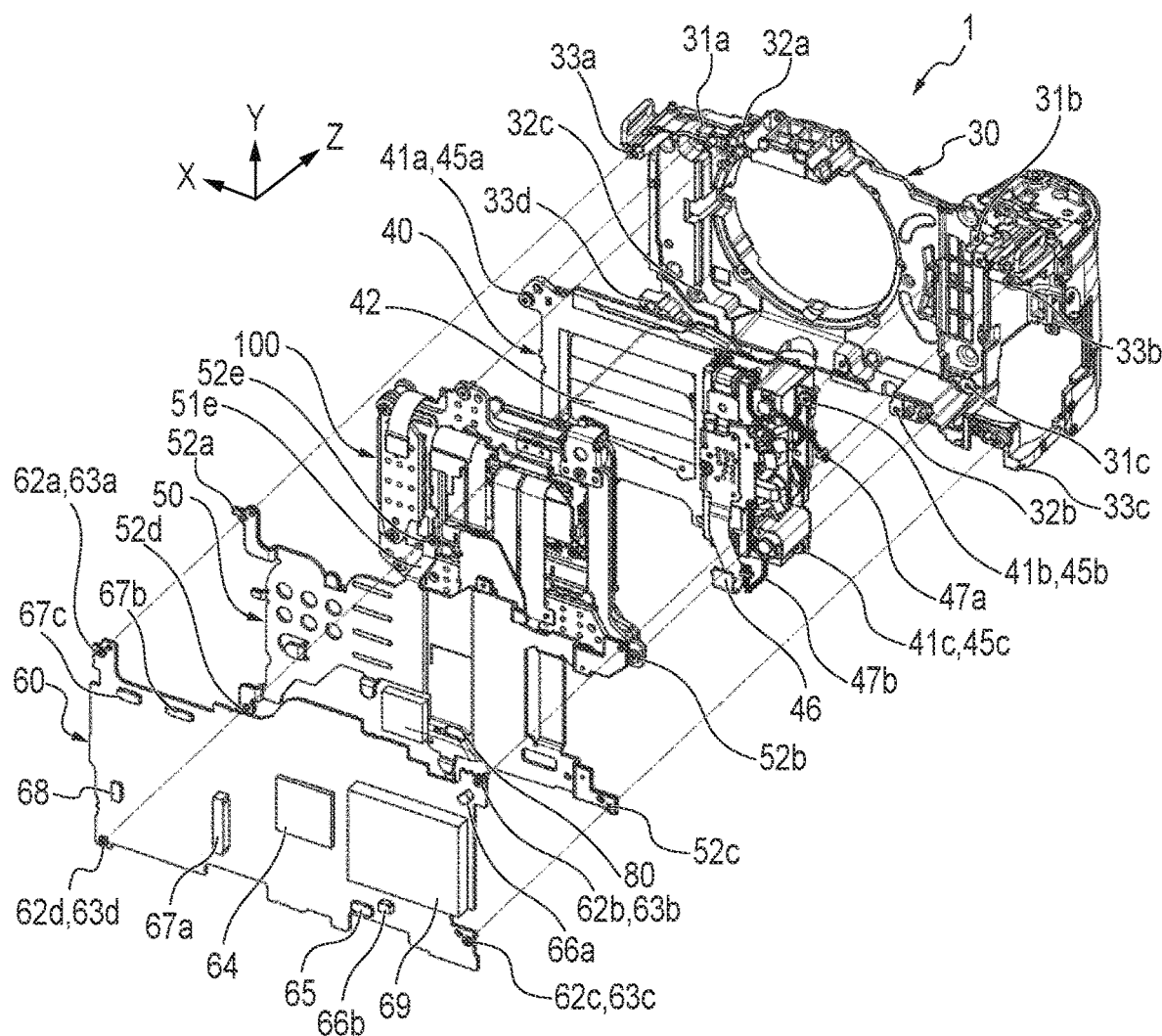
FIG. 2 is an exploded perspective view of an interior of the image pickup apparatus.

FIG. 2 is an exploded perspective view of an inner part of the image pickup apparatus 1. FIG. 2 mainly shows component elements needed to explain the internal arrangement of the image pickup apparatus 1. The image pickup apparatus 1 has a base member 30, a shutter member 40, an image stabilization mechanism 100, a heat transfer plate 50, and a main circuit board 60. They are arranged such that the shutter member 40, the image stabilization mechanism 100, the heat transfer plate 50, and the main circuit board 60 are incorporated in this order into the base member 30 in a direction of an optical axis.

The base member 30 is a metallic member formed of a magnesium alloy by die casting and has high stiffness. The lens mount unit 28 (see FIG. 1A) is fixed to the base member 30. Screw holes 31a, 31b, and 31b, mounting holes 32a, 32b, and 32c, and screw holes 33a, 33b, 33c, and 33d are formed in the base member 30.

The shutter member 40 is disposed in contact with the base member 30. The shutter member 40 has a mechanism that opens/closes a shutter curtain 42 by causing it to run.

Opening the shutter curtain 42 causes a subject light to be projected onto the image pickup device 600 for a desired period of time. The shutter member 40 has holes 41a, 41b, and 41c. By screwing screws 45a, 45b, and 45c to the screw holes 31a, 31b, and 31c of the base member 30 via the holes 41a, 41b, and 41c, the shutter member 40 is fixed to the base member 30.

The shutter member 40 has a flexible printed circuit board 46 and lead wires 47a and 47b. By connecting the flexible printed circuit board 46 to a connector 65 of the main circuit board 60 and connecting the lead wires 47a and 47b to connectors 66a and 66b of the main circuit board 60, the shutter member 40 is electrically connected to the main circuit board 60 so that it can send and receive signals to and from the main circuit board 60.

The heat transfer plate 50 is a metal sheet member formed of a metallic material (aluminum, copper, etc.) with high thermal conductivity, and is a heat transfer member. The heat transfer plate 50 is comprised of a material with higher thermal conductivity than that of the base member 30. The heat transfer plate 50 has holes 52a, 52b, 52c, 52d, and 52e.

The main circuit board 60 is a circuit board constituting an electronic circuit and has the property of generating heat. Circuit components which generate heat such as a CPU 64 and a card connector 64 are mounted on a surface of the main circuit board 60. The CPU 64 is a main heating element. The connectors 65, 66a, 66b, 67a, 67b, 67c, and 68 are also mounted on the main circuit board 60. The main circuit board 60 is electrically connected to a connecting member such as the flexible printed circuit board 46 via the connector. The main circuit board 60 has holes 62a, 62b, 62c, and 62d, and screws 63a, 63b, 63c, and 63d. The screws 63a, 63b, 63c, and 63d are screwed to the screw holes 33a, 33b, 33c, and 33d, respectively, of the base member 30 via the holes 62a, 62b, 62c, and 62d and the holes 52a, 52b, 52c, and 52d of the heat transfer plate 50. As a result, the main circuit board 60 and the heat transfer plate 50 are screwed together and fixed to the base member 30. The screw holes 33a, 33b, 33c, and 33d of the base member 30 correspond to "first connecting units" that support the main circuit board 60 and the heat transfer plate 50 in a stacked manner at a plurality of locations.

Figure 3A:
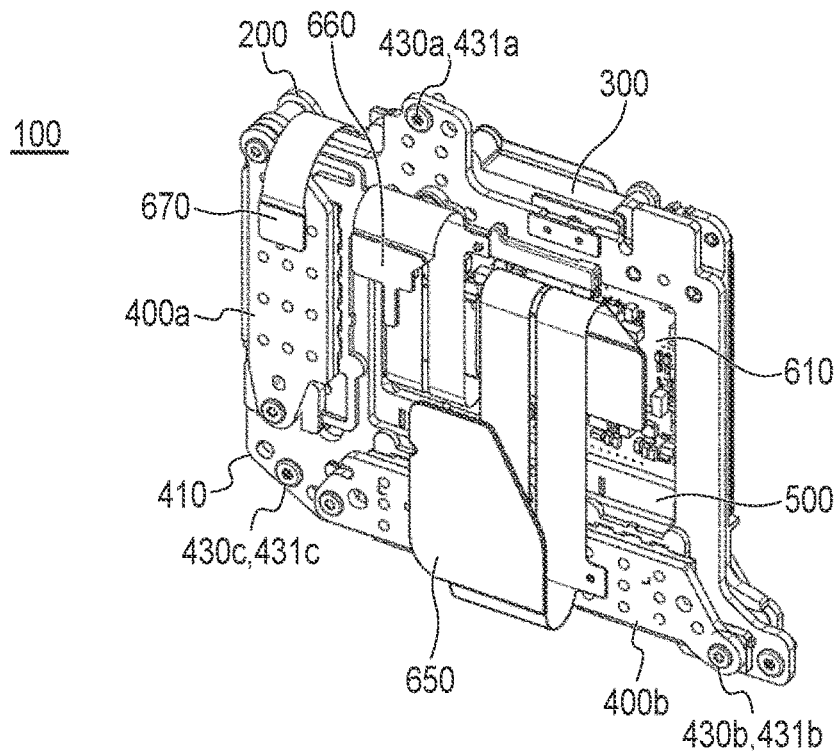
FIG. 3A is a perspective view of an image stabilization mechanism.
Figure 3B:
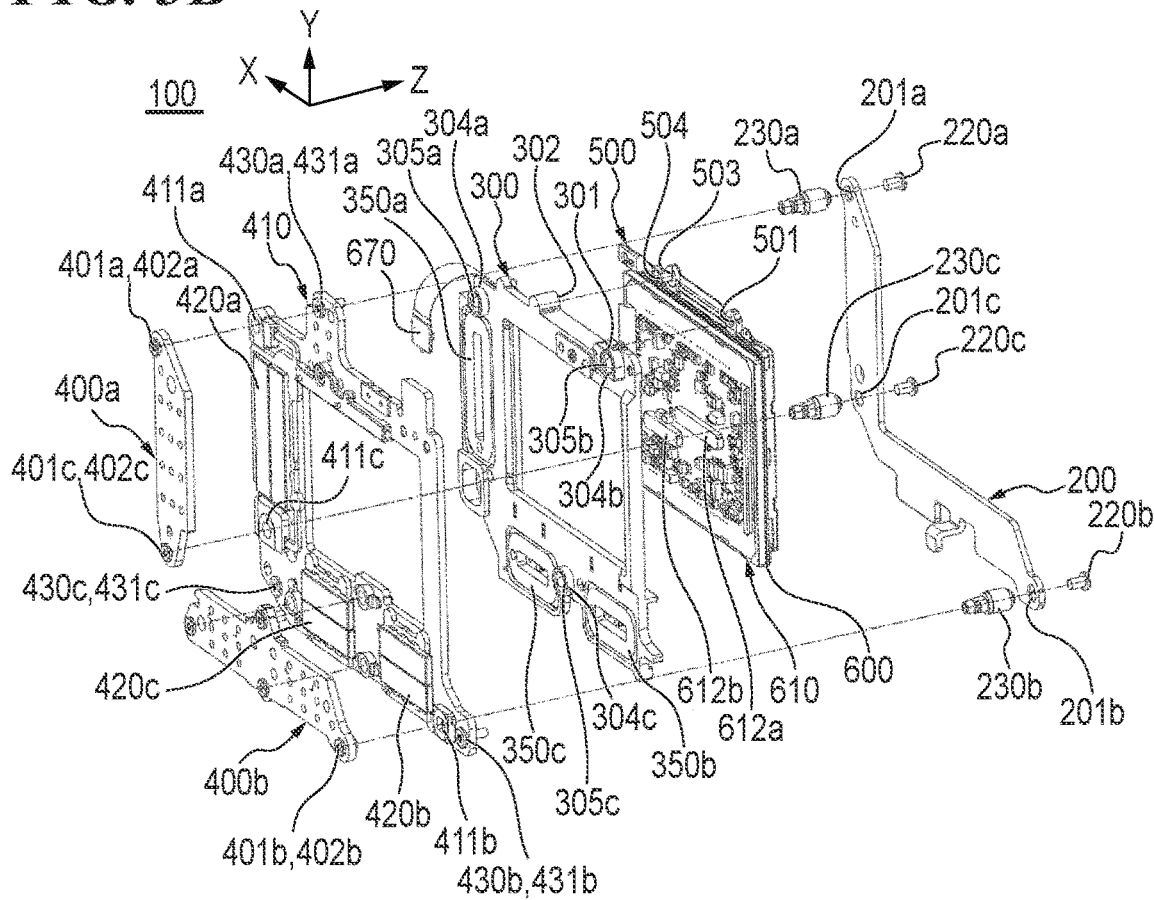
FIG. 3B is an exploded perspective view of the image stabilization mechanism.

FIG. 3A is a perspective view of the image stabilization mechanism 100, and FIG. 3B is an exploded perspective view of the image stabilization mechanism 100. The image stabilization mechanism 100 has a front yoke 200, a movable frame 300, a base plate 410, a rear yoke 400a, a rear yoke 400b, a sensor plate 500, and a sensor circuit board 610.

Holes 201a, 201b, and 201c are formed in the front yoke 200. Magnets 420a, 420b, and 420c are adhered and fixed to the base plate 410. The rear yokes 400a and 400b are disposed so as to cover one side (−Z side) surfaces of the magnets 420a, 420b, and 420c. Holes 401a and 401c are formed in the rear yoke 400a, and a hole 401b is formed in the rear yoke 400b. Screws 402a, 402b, and 402c are provided correspondingly to the holes 401a, 401b, and 401c.

The magnets 420a, 420b, and 420c form a magnetic circuit between the front yoke 200 and the rear yokes 400a and 400b. This magnetic circuit constitutes what is called a closed magnetic path. Each of the magnets 420a, 420b, and 420c is magnetized such that a magnetic flux is produced in the direction of the optical axis (Z-axis direction), and a strong attractive force is generated between the front yoke 200 and the base plate 410. The front yoke 200 and the base plate 410 are configured to maintain a predetermined interval with using spacers 230a, 230b, and 230c.

Holes 411a, 411b, and 411c are formed in the base plate 410. The spacers 230a, 230b, and 230c are disposed between the holes 411a, 411b, and 411c formed in the base plate 410 and the holes 201a, 201b, and 201c formed in the front yoke 200. Screws 220a, 220b, and 220c are screwed to the spacers 230a, 230b, and 230c from the front yoke 200 side, and the screws 402a, 402b, and 402c are screwed to the spacers 230a, 230b, and 230c from the rear yoke 400a, 400b side. As a result, the front yoke 200 and the rear yokes 400a and 400b are screwed together and fixed. Rubber is disposed in barrel portions of the spacers 230a, 230b, and 230c. The rubber in the barrel portions of the spacers 230a, 230b, and 230c acts as a stopper for the movable frame 300 that is moving.

Holes 430a, 430b, and 430c are formed in the base plate 410 at locations corresponding to the mounting holes 32a, 32b, and 32c of the base member 30. By screws 431a, 431b, and 431c being screwed to the mounting holes 32a, 32b, and 32c via the holes 430a, 430b, and 430c, the base plate 410 is fixed to the base member 30. On this occasion, by a washer (not shown) being sandwiched between the base plate 410 and the base member 30, the inclination of the image stabilization mechanism 100 is adjusted.

The movable frame 300, which is formed by magnesium die casting or aluminum die casting, is lightweight and has high stiffness. The movable frame 300 is located between the front yoke 200 and the base plate 410 in the direction of the optical axis. The movable frame 300 has balls 305a, 305b, and 305c. The balls 305a, 305b, and 305c are sandwiched between receiving portions 304a, 304b, and 304c of the movable frame 300 and the base plate 401 such that they can roll.

Coils 350a, 350b, and 350c are adhered and fixed to the movable frame 300 at locations opposed to the magnets 420a, 420b, and 420c of the base plate 410. By the coils 350a, 350b, and 350c being soldered to a flexible printed circuit board 670, the flexible printed circuit board 670 is brought into electrical conduction with the coils 350a, 350b, and 350c. The flexible printed circuit board 670 has a position detecting element, not shown. A Hall element or the like is used as the position detecting element so as to detect a position using the magnetic circuit described above. The Hall element is small and thus can be disposed inside windings of the coils 350a, 350b, and 350c. By the flexible printed circuit board 670 being connected to the connector 67c mounted on the main circuit board 60 (FIG. 2), the main circuit board 60 and the coils 350a, 350b, and 350c are electrically connected together.

The image pickup device 600 is mounted on one side (+Z side) surface of the sensor circuit board 610. Various circuit elements are mounted on a surface on a side (−Z side) opposite to the side of the sensor circuit board 610 on which the image pickup device 600 is mounted. Connectors 612a and 612b are mounted on the sensor circuit board 610. Flexible printed circuit boards 650 and 660 (FIG. 3A) are connected to the connectors 612a and 612b, respectively. Other ends of the flexible printed circuit boards 650 and 660 are connected to the connectors 67a and 67b, respectively, mounted on the main circuit board 60. As a result, the main circuit board 60 and the sensor circuit board 610 are electrically connected together.

The sensor plate 500 is a metal sheet member formed of metal (aluminum, copper, etc.) with high thermal conductivity. The image pickup device 600 on the sensor circuit board 610 is fixed to the sensor plate 500 by UV adhesion. A positioning hole 501 is formed in the sensor plate 500 at a location corresponding to a positioning boss 301 formed in the movable frame 300. A hole 503 is also formed in the sensor plate 500 at a location corresponding to a screw hole 302 formed in the movable frame 300. By a screw 504 being screwed to the screw hole 302 via the hole 503, the sensor plate 500 is fixed to the movable frame 300.

In the image stabilization mechanism 100 described above, a force according to Fleming's left hand rule is generated by passing electric current through the coils 350a, 350b, and 350c. As a result, the movable frame 300, and thus the image pickup device 600 can be moved in a direction vertical to the direction of the optical axis, that is, within a plane perpendicular to the optical axis CO. Moving the movable frame 30 can correct for camera shake. Detailed description of how to control the image stabilization mechanism 100 is omitted here.

Figure 4A:
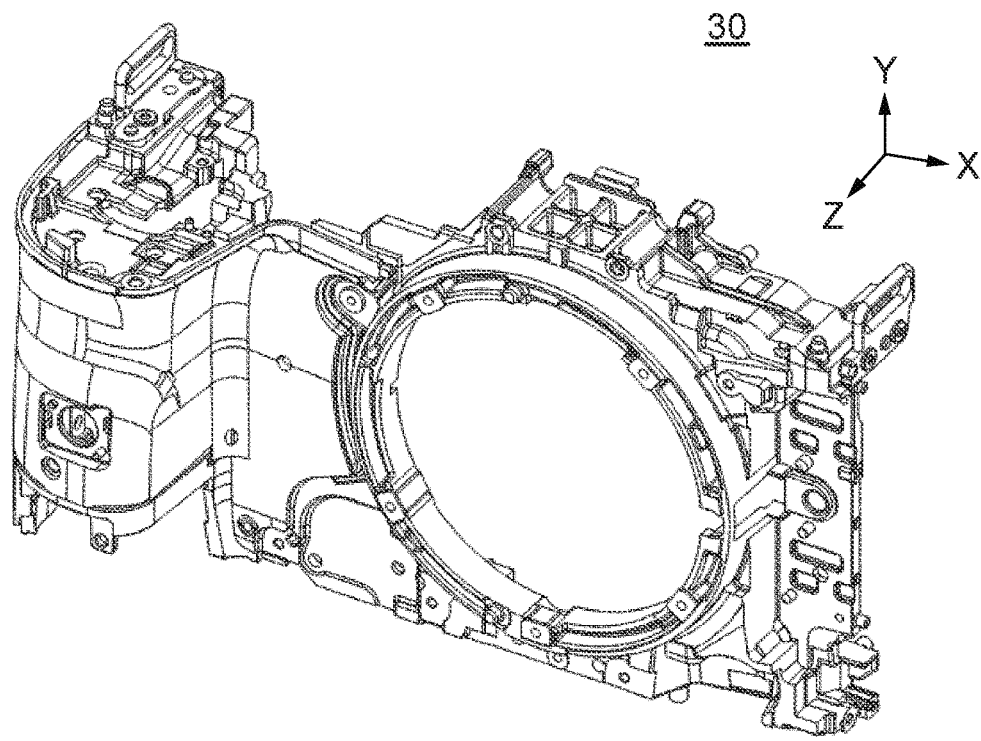
FIG. 4A is a perspective view of a front side of a base member.
Figure 4B:
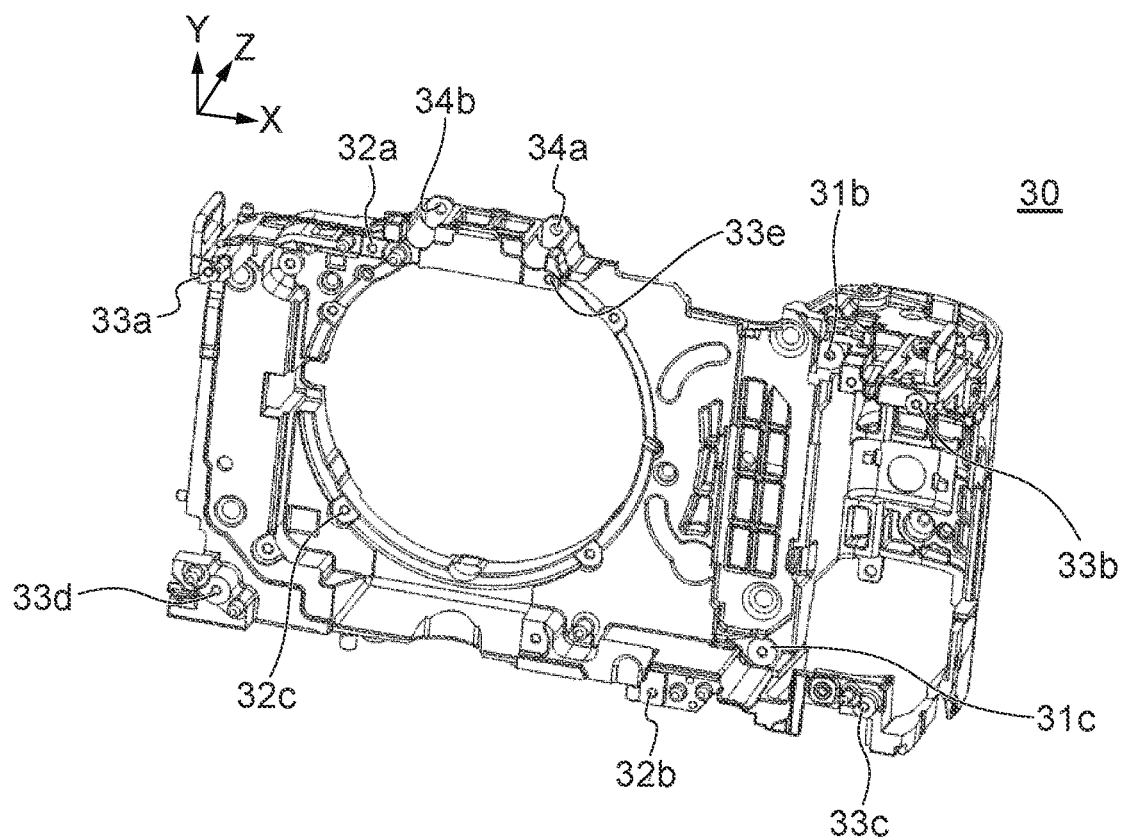
FIG. 4B is a perspective view of a rear side of the base member.

FIG. 4A is a perspective view of a front side of the base member 30, and FIG. 4B is a perspective view of a rear side of the base member 30. The base member 30 has the screw holes 33a, 33b, 33c, and 33d for fixing the main circuit board 60 and the heat transfer plate 50 as well as the mounting holes 32a, 32b, and 32c for fixing the base plate 410. The base plate 30 also has a screw hole 33e at a location that does not interfere with fixing of the main circuit board 60. The screw hole 33e is provided so as to fix the heat transfer plate 50 correspondingly to the hole 52e (FIGS. 2 and 5) of the heat transfer plate 50. The screw hole 33e corresponds to a "second connecting unit" that supports the heat transfer plate 50. Through holes 34a and 34b for use in fixing the upper cover 110 by screws are provided in an upper front part of the base member 30.

Figure 5:
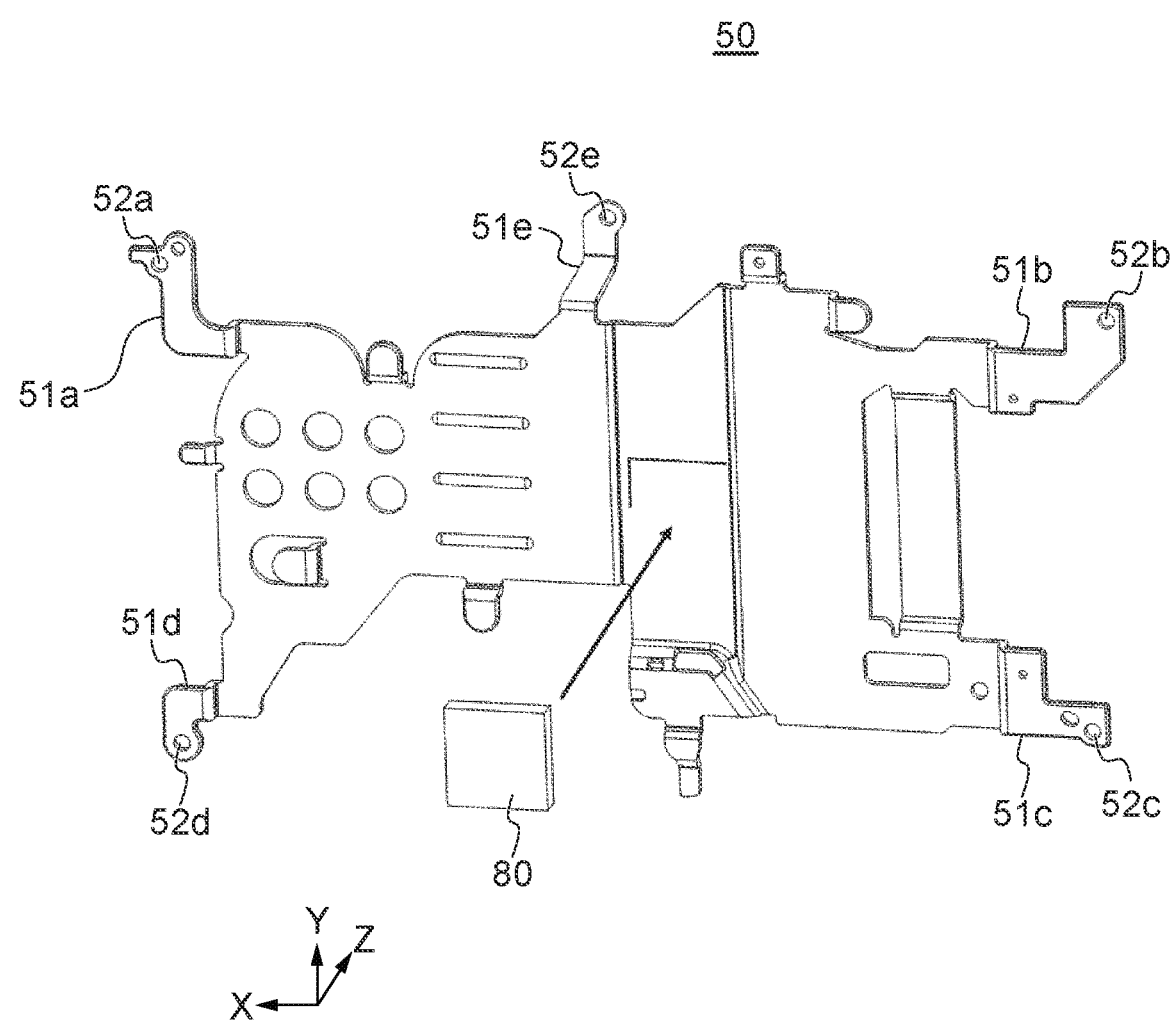
FIG. 5 is a perspective view of a heat transfer plate.

FIG. 5 is a perspective view of the heat transfer plate 50. FIG. 5 also shows heat transfer rubber 80 that is attached and fixed to the heat transfer plate 50. By bending process and drawing process on a plurality of locations of the heat transfer plate 50, the heat transfer plate 50 is shaped to avoid interference with other components and also have high strength. Arm portions 51a, 51b, 51c, and 51d for receiving and screwing together the main circuit board 60 are formed at upper, lower, left, and right ends of the heat transfer plate 50. Holes 52a, 52b, 52c, and 52d are formed at ends of the arm portions 51a, 51b, 51c, and 51d, respectively. The holes 52a, 52b, 52c, and 52d are used for screw fastening into the screw holes 33a, 33b, 33c, and 33d of the base member 30.

The heat transfer rubber 80 is attached to an area close to the center of the heat transfer plate 50. The heat transfer rubber 80 is in pressure contact with the main circuit board 60. The heat transfer plate 50 has an arm portion 51e as well as the arm portions 51a, 51b, 51c, and 51d. The hole 52e is formed at an end of the arm portion 51e. The holes 52a, 52b, 52c, and 52d are located on the same plane perpendicular to the optical axis. The arm portion 51e is bent forward. Thus, the hole 52e in the arm portion 51e is not on the same plane as the holes 52a, 52b, 52c, and 52d and is located forward of the holes 52a, 52b, 52c, and 52d in the direction of the optical axis. The screw holes 33a, 33b, 33c, and 33d which are the first connecting units correspond to the holes 52a, 52b, 52c, and 52d in the heat transfer plate 50, and the screw hole 33e which is the second connecting unit corresponds to the hole 52e. Thus, the second connecting unit is located forward of the first connecting units in the direction of the optical axis.

Figure 6A:
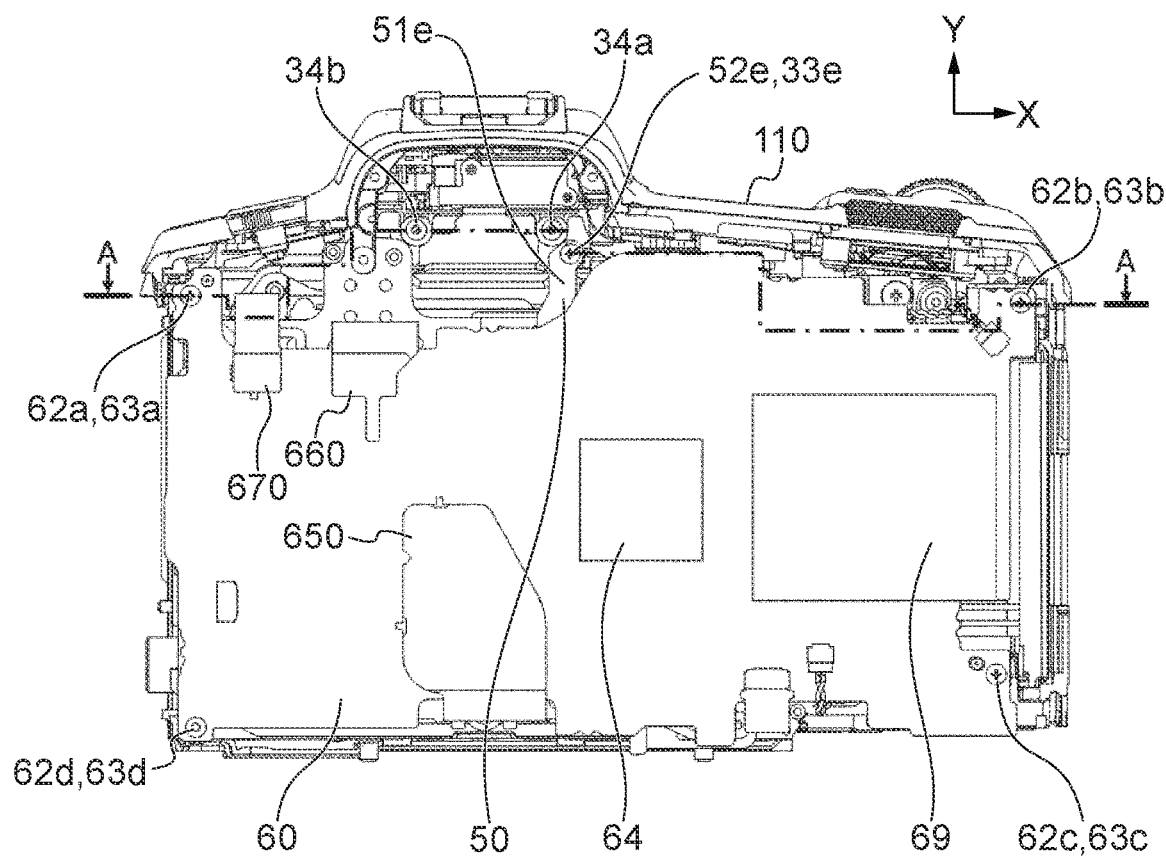
FIG. 6A is a rear view of a state in which an upper cover, the base member, the heat transfer plate, and a main circuit board are fitted together.
Figure 6B:
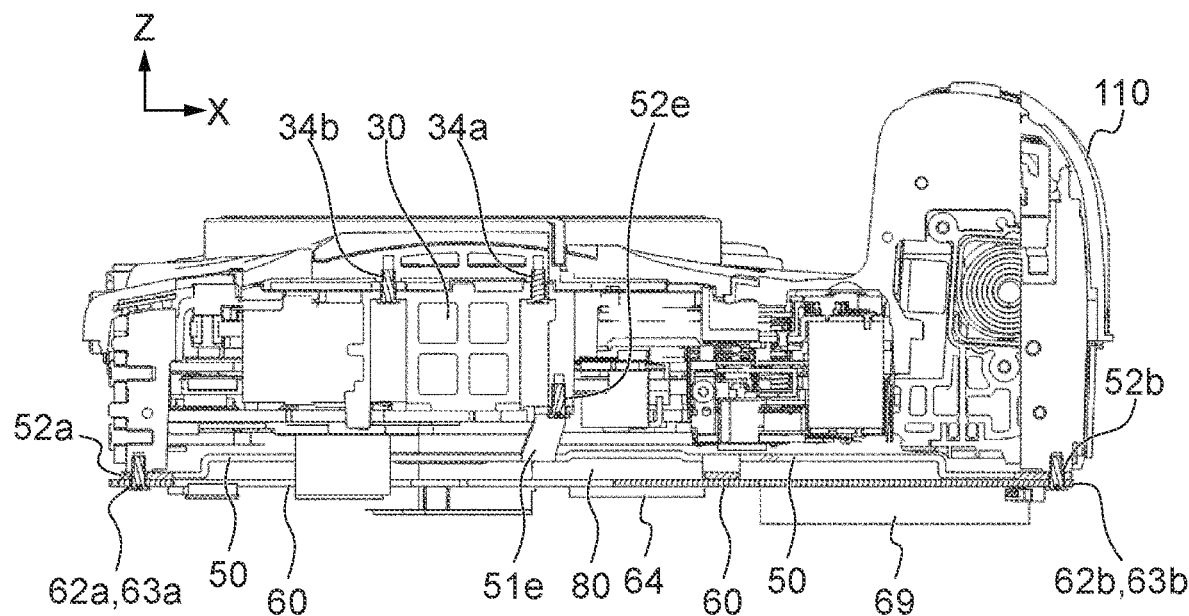
FIG. 6B is a cross-sectional view taken along a line A-A in FIG. 6A.

Next, referring to FIGS. 6A and 6B, a description will be given of how the upper cover 110, the base member 30, the heat transfer plate 50, and the main circuit board 60 are fitted together. FIG. 6A is a rear view of the upper cover 110, the base member 30, the heat transfer plate 50, and the main circuit board 60 which are fitted together, and FIG. 6B is a cross-sectional view taken along a line A-A in FIG. 6A.

A plurality of components is mounted on the main circuit board 60. Accordingly, the main circuit board 60 is fixed to the heat transfer plate 50 by the screws 63a, 63b, 63c, and 63d in the vicinity of four corners (four ends i.e. upper, lower, left, and right ends) which have little effect on wiring of circuit components and do not interfere with paths on the flexible printed circuit board to the connectors.

Heat of the main circuit board 60 tends to disperse in all directions because the screw holes 33a, 33b, 33c, and 33d (the first connecting units) of the base member 30 are located at positions corresponding to the four ends i.e. the upper, lower, left, and right ends of the main circuit board 60.

The flexible printed circuit boards 650 and 660 extended from the sensor circuit board 610 are connected to the connectors 67a and 67b (FIG. 2) mounted on the main circuit board 60. The flexible printed circuit board 670 extended from the image stabilization mechanism 100 is connected to the connector 67c (FIG. 2) mounted on the main circuit board 60. The other connecting units and elements are omitted from the drawings or shown in a simplified manner in the drawings.

As shown in FIG. 6B, in the direction of the optical axis (Z-axis direction), the heat transfer plate 50 is disposed between the main circuit board 60 and the base member 30. As described above, the main circuit board 60, the heat transfer plate 50, and the base member 30 are screwed together and fixed by the screws 63a, 63b, 63c, and 63d. To fix the main circuit board 60, the holes 62a, 62b, 62c, and 62d are provided on the same plane, and the holes 52a, 52b, 52c, and 52d are also provided on the same plane. By the screw being screwed to the screw hole 33e via the hole 52e, the heat transfer plate 50 is fixed to the base member 30.

The heat transfer rubber 80 attached to the heat transfer plate 50 is sandwiched between the main circuit board 60 and the heat transfer plate 50. The heat transfer rubber 80 is a thermal coupling unit that thermally couples the main circuit board 60 and the heat transfer plate 50 to each other. The position at which the heat transfer rubber 80 is attached overlaps the CPU 64 on the main circuit board 60 when projected in the direction of the optical axis (Z-axis direction). As a result, heat generated from the CPU 64 is efficiently transferred to the heat transfer plate 50. It should be noted that from this viewpoint, at least a part of the heat transfer rubber 80 and at least a part of the CPU 64 may overlap each other as seen in the direction of the optical axis.

In the base member 30, the through holes 34a and 34b are provided so as to fix the upper cover 110. The through hole 34a corresponds to a "third connecting unit" that supports the upper cover 110. Screw bases are provided in the base member 30 and the upper cover 110. The base member 30 is fastened to the upper cover 110 by screws via the through holes 34a and 34b. Thus, the base member 30 is fixed to the upper cover 110 at two locations i.e. the through holes 34a and 34b. From this viewpoint, the base member 30 is a chassis to which the upper cover 110 which is an exterior member is fitted.

A main heat source inside the apparatus is the CPU 64 mounted on the main circuit board 60. Heat generated from the CPU 64 is efficiently transferred to the upper cover 110 at a relatively distant location on a heat dissipation path, while being transferred to the heat transfer plate 50 to be dispersed. Thus, in the present embodiment, heat transfer paths from the CPU 64 to the upper cover 110 are formed by using the heat transfer rubber 80 and the heat transfer plate 50. The heat transfer plate 50 has higher thermal conductivity than that of the base member 30, and hence heat is efficiently transferred by a structure in which the heat transfer plate 50 being extended, not the base member 30 being extended.

Main heat transfer paths are formed as described hereafter. Heat generated by the CPU 64 is transferred to the main circuit board 60 and then transferred, via the screws (e.g. 63*a*), the holes (e.g. 62*a*) in the main circuit board 60, the holes (e.g. 52*a*) in the heat transfer plate 50, and the screw holes (e.g. 33*a*) (the first connecting units) in the base member 30, to the base member 30. This is a first heat transfer path. A large amount of heat generated from the CPU 64 is transferred from the main circuit board 60 to the heat transfer plate 50 via the heat transfer rubber 80 and dispersed. Furthermore, heat that has been transferred from the heat transfer rubber 80 to the heat transfer plate 50 is transferred, via the hole 52*e* of the arm portion 51*e* and the screw hole 33*e* (the second connecting unit) of the base member 30, to the base member 30 (a second heat transfer path). It should be noted that the heat that has been transferred from the heat transfer rubber 80 to the heat transfer plate 50 and dispersed is transferred to the base member 30 via the first connecting units as well (a third heat transfer path). From the base member 30, heat is transferred to the upper cover 110 via the through hole 34*a* (the third connecting unit) (a fourth heat transfer path). The upper cover 110 is metallic and relatively voluminous, and hence it has high heat capacity and high dispersibility. Therefore, the upper cover 110 is capable of efficiently absorbing heat from the base member 30.

As shown in FIG. 6A, the hole 52*e* is provided near the center, in the horizontal direction (the direction of the X axis), of the image pickup apparatus 1 and close to the top of the image pickup apparatus 1. Accordingly, the screw hole 33*e* (the second connecting unit) corresponding to the hole 52*e* is provided between the holes 62*a* and 62*b* of the main circuit board 60, that is, between (almost midway between) the screw holes 33*a* and 33*b* in the horizontal direction. Similarly, the through hole 34*a* (the third connecting unit) is provided between the holes 62*a* and 62*b* of the main circuit board 60, that is, between the screw holes 33*a* and 33*b* in the horizontal direction. With this arrangement, heat of the main circuit board 60 is easily transferred from the base cover 30 to the upper cover 110 via the arm portion 51*e*.

Furthermore, as seen from above, regarding positions in the horizontal direction, both of the screw hole 33*e* (the second connecting unit) and the through hole 34*a* (the third connecting unit) overlaps the heat transfer rubber 80. Namely, as seen from above, each of the screw hole 33*e* and the through hole 34*e*, and the heat transfer rubber 80 are arranged in the Z direction. Moreover, as seen in the direction of the optical axis, the screw hole 33*e* is located close to (in vicinity of) the through hole 34*a*. This arrangement shortens the heat transfer paths extending through the heat transfer rubber 80 and the arm portion 51*e*, that is, the heat transfer paths (including the second and fourth heat transfer paths) over which heat is transferred in the following order: the CPU 64→the main circuit board 60→the heat transfer rubber 80→the arm portion 51*e* of the heat transfer plate 50→the base member 30→the upper cover 110.

In directions (X-Y directions) perpendicular to the optical axis CO, both the distance between the screw hole 33*e* and the CPU 64 and the distance between the through hole 34*a* and the CPU 64 are shorter than the shortest one of distances between the screw holes 33*a*, 33*b*, 33*c*, and 33*d* and the CPU 64. This arrangement can shorten the second and fourth heat transfer paths.

In the directions (X-Y directions) perpendicular to the optical axis CO, the through hole 34*a* is located close to (in the vicinity of) the hole 52*e*. Particularly, in the X-Y directions, the distance between the screw hole 33*e* and the through hole 34*a* is shorter than the shortest one of distances between the screw holes 33*a*, 33*b*, 33*c*, and 33*d* and the screw hole 33*e*. Also, the distance between the screw hole 33*e* and the through hole 34*a* is shorter than the shortest one of distances between the screw holes 33*a*, 33*b*, 33*c*, and 33*d* and the through hole 34*a*. This arrangement can shorten the fourth heat transfer path.

As described above, due to the relationship in distance between the components with respect to the directions perpendicular to the optical axis CO, the efficiency of heat transfer through the second and third connecting units can be increased relative to the efficiency of heat transfer through the first connecting units.

By appropriately designing the cross-sectional areas of the arm portions 51*a*, 51*b*, 51*c*, and 51*d* provided at the four corners of the heat transfer plate 50, it is easy to adjust the amount of heat transferred to the first connecting units. Also, by appropriately designing the cross-sectional area of the arm portion 51*e*, it is easy to adjust the amount of heat transferred to the second connecting unit. For example, by making the cross-sectional area of the arm portion 51*e* larger than the cross-sectional areas of the arm portions 51*a*, 51*b*, 51*c*, and 51*d*, the amount of heat transferred to the upper cover 110 can be increased, and by making the cross-sectional area of the arm portion 51*e* smaller, the amount of heat transferred to the upper cover 110 can be reduced.

According to the present embodiment, the heat transfer plate 50 with higher thermal conductivity than that of the base member 30 is disposed between the main circuit board 60 and the base member 30 in the direction of the optical axis. The base member 30 has the first connecting units (33*a*, 33*b*, 33*c*, 33*d*) that support the main circuit board 60 and the heat transfer plate 50 in a stacked manner at least two locations (33*a*, 33*b*) different from each other in the horizontal direction. In the base member 30, both the second connecting unit (33*e*) and the third connecting unit (34*a*) are provided between the screw holes 33*a* and 33*b* of the first connecting unit in the horizontal direction. As a result, heat of the main circuit board 60 can be efficiently dispersed.

Moreover, as seen in the direction of the optical axis, at least a part of the heat transfer rubber 80 and at least a part of the CPU 64 overlap each other, and this improves the transfer efficiency of heat generated by the CPU 64.

Furthermore, in the horizontal direction, both the location of the screw hole 33*e* and the location through hole 34*a* overlap the location of the heat transfer rubber 80. In addition, as seen in the direction of the optical axis, the screw hole 33*e* is located close to (in vicinity of) the through hole 34*a*. With this arrangement, the heat transfer paths through the heat transfer rubber 80 and the second and third connecting units can be shortened.

Moreover, in the directions perpendicular to the optical axis CO, both the distance between the screw hole 33*e* and the CPU 64 and the distance between the through hole 34*a* and the CPU 64 are shorter than the shortest one of distances between the screw holes 33*a*, 33*b*, 33*c*, and 33*d* and the CPU 64. Also, in the directions perpendicular to the optical axis CO, the distance between the screw hole 33*e* and the through hole 34*a* is shorter than the shortest one of distances between the screw holes 33*a*, 33*b*, 33*c*, and 33*d* and the screw hole 33*e*. In addition, the distance between the screw hole 33*e* and the through hole 34*a* is shorter than the shortest one of distances between the screw holes 33*a*, 33*b*, 33*c*, and 33*d* and the through hole 34a. This arrangement makes it easier to make the efficiency of heat transfer through the second and third connecting units relatively high.

Moreover, since the screw holes 33a, 33b, 33c, and 33d of the base member 30 are located at the positions corresponding to the four ends i.e. the upper, lower, left, and right ends of the main circuit board 60, heat of the main circuit board 60 can be easily dispersed in all directions.

It should be noted that although the heat transfer plate 50 whose main body is integrated with the arm portion 51e has been described above, the main body and the arm portion 51e may be configured as separate units, and the heat transfer plate 50 may be constructed by fixing the arm portion 51e to the main body. In this case, the thermal conductivity of the arm portion 51e should be higher than that of the base member 30. For example, the arm portion 51e may be made of a sheet member such as a graphite sheet, and the main body of the heat transfer plate 50 may be connected to the base member 30.

OTHER EMBODIMENTS

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2020-076140, filed on Apr. 22, 2020 which is hereby incorporated by reference herein in its entirety.

What is claimed is:

1. An image pickup apparatus comprising:
   an exterior member;
   a circuit board on which a heating element is mounted;
   a chassis to which the exterior member is fitted; and
   a heat transfer member which is made of a material with higher thermal conductivity than that of the chassis and is disposed between the circuit board and the chassis in a direction of an optical axis,
   wherein the chassis comprises:
      first connecting units that support the circuit board and the heat transfer member in a stacked manner at a plurality of positions including two positions different from each other in a horizontal direction; and
      a second connecting unit that supports the heat transfer member;
      a third connecting unit that supports the exterior member,
      wherein both the second connecting unit and the third connecting unit are provided between the two positions of the first connecting units in the horizontal direction.

2. The image pickup apparatus according to claim 1, further comprising:
   a thermal coupling unit configured to thermally couple the circuit board and the heat transfer member to each other,
   wherein at least a part of the thermal coupling unit and at least a part of the heating element overlap each other in the optical axis direction.

3. The image pickup apparatus according to claim 2, wherein a location of the second connecting unit overlaps a location of the thermal coupling unit with respect to the horizontal direction.

4. The image pickup apparatus according to claim 3, wherein a location of the third connecting unit overlaps a location of the thermal coupling unit with respect to the horizontal direction.

5. The image pickup apparatus according to claim 2, wherein in a direction perpendicular to the optical axis, a distance between the second connecting unit and the heating element and a distance between the third connecting unit and the heating element are both shorter than a shortest one of distances between the first connecting units and the heating element.

6. The image pickup apparatus according to claim 1, wherein in a direction perpendicular to the optical axis, a distance between the second connecting unit and the third connecting unit is shorter than both a shortest one of distances between the first connecting units and the second connecting unit and a shortest one of distances between the first connecting units and the third connecting unit.

7. The image pickup apparatus according to claim 1, wherein the first connecting units are located at positions corresponding to four ends consisting of upper, lower, left, and right ends of the circuit board.

8. The image pickup apparatus according to claim 1, wherein the second connecting unit is located forward of the first connecting units in the direction of the optical axis.

9. The image pickup apparatus according to claim 1, wherein the heat transfer member is made of a metallic material or a graphite sheet.

10. The image pickup apparatus according to claim 1, wherein the heat transfer member has an arm portion that corresponds to the second connecting unit, and
   wherein the arm portion is made of a material with higher thermal conductivity than that of the chassis.

* * * * *